US006370066B1

(12) United States Patent
Nagano

(10) Patent No.: US 6,370,066 B1
(45) Date of Patent: Apr. 9, 2002

(54) DIFFERENTIAL OUTPUT CIRCUIT

(75) Inventor: Hideo Nagano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/779,825

(22) Filed: Feb. 9, 2001

(30) Foreign Application Priority Data

Sep. 7, 2000 (JP) ....................................... 2000-271364

(51) Int. Cl.[7] .................................................. G11C 7/00

(52) U.S. Cl. ............................. 365/189.09; 365/189.11; 327/63; 327/66

(58) Field of Search ....................... 365/189.09, 189.11, 365/189.05; 327/66, 63

(56) References Cited

U.S. PATENT DOCUMENTS 6,292,031 B1 * 9/2001 Thompson et al. ........... 327/66

FOREIGN PATENT DOCUMENTS

JP 61-147610 7/1986

OTHER PUBLICATIONS

Designing Technique of Analog Integrated Circuit for Super–LSI (the second volume), P.R. Gray and R.G. Maier, K.K. Baihukan, Nov. 30, 1990.

* cited by examiner

*Primary Examiner*—Vu A. Le
(74) *Attorney, Agent, or Firm*—Burns, Doane, Swecker & Mathis, LLP

(57) ABSTRACT

A differential output circuit is composed of a constant-current circuit section having a reference voltage circuit, an amplification circuit, a resistance, an N-channel MOS transistor and a P-channel MOS transistor; a mirror circuit section having three P-channel MOS transistors; a data transmission switch circuit section having a data input terminal, an inverter circuit, positive and negative output terminals, and two N-channel MOS transistors; and an offset level adjusting circuit section having a resistance.

13 Claims, 4 Drawing Sheets

DIFFERENTIAL OUTPUT CIRCUIT

FIELD OF THE INVENTION

The present invention in general relates to a differential output circuit. More specifically this invention relates to a differential output circuit such as LVDS (Low Voltage Differential Signaling, hereinafter shown as LVDS) having high speed, low voltage and low noise transmission.

BACKGROUND OF THE INVENTION

FIG. 7 shows a conventional differential output circuit. This differential output circuit is provided with a resistance R1' whose one terminal is connected to GND, and N-channel MOS transistors M3' and M4' whose sources are connected to the other terminal of the resistance R1'.

Further, an inverter circuit 5', an N-channel MOS transistor M1' and an N-channel MOS transistor M2' are provided. The inverter circuit 5' inverts data VI input through a data input terminal. A gate of the N-channel MOS transistor M1' is connected to an output terminal of the inverter circuit 5', and its source is connected to a drain of the N-channel MOS transistor M4'. Agate of the N-channel MOS transistor M2' is connected to the data input terminal, and its source is connected to a drain of the N-channel MOS transistor M3'.

Further, a gate of the N-channel MOS transistor M3' is also connected to the output terminal of the inverter circuit 5', and a gate of the N-channel MOS transistor M4' is also connected to the data input terminal.

Moreover, the drain of the N-channel MOS transistor M3' is connected to an output terminal VO+, and the drain of the N-channel MOS transistor M4' is connected to the output terminal VO−.

In addition, drains of the N-channel MOS transistors M1' and M2' are connected to a power-supply potential Vcc.

Further, an external load resistance RT is connected between the output terminals VO+ and VO−.

In this conventional differential output circuit, a constant-current source I1' turns ON a pair of transistors composed of the N-channel MOS transistors M1' and M3' or the N-channel MOS transistors M2' and M4' so that a constant current always drives the external load resistance RT.

FIG. 8 is an output waveform chart of the conventional LVDS. Offset level VOS (hereinafter, referred to as VOS) of an output amplitude is determined by the product of the constant-current source I1' and the resistance R1'. However, in a semiconductor using the conventional differential output circuit, there arises a problem that it is difficulty to control VOS with high accuracy due to the presence of variation in the constant-current source I1' or the resistance R1'.

SUMMARY OF THE INVENTION

The differential output circuit of the present invention which utilizes LVDS for high speed, low-voltage and low noise transmission is provided with the reference voltage circuit which outputs a constant voltage even if temperature, power-supply voltage and manufacturing process vary.

Further, a constant-current circuit section is provided. This constant-current circuit section having a) a reference voltage circuit which outputs a constant voltage even if any of the temperature, power-supply voltage and semiconductor manufacturing process varies, b) a first resistance whose one terminal is connected to GND, c) a first conductive MOS transistor whose source is connected to the other terminal of the first resistance, d) a second conductive MOS transistor whose a source is connected to a power-supply potential and a drain is connected to a drain of the first conductive MOS transistor, and e) an amplification circuit whose an output terminal of the reference voltage circuit is connected to a positive input terminal, a negative input terminal is connected to the source of the first conductive MOS transistor, and an output terminal is connected to a gate of the first conductive MOS transistor.

Further, a mirror circuit section is provided. This mirror circuit section having a) a third conductive MOS transistor whose source is connected to the power-supply potential and gate is connected to a gate of the second conductive MOS transistor, and b) a fourth conductive MOS transistor and a fifth conductive MOS transistor whose sources are connected to a drain of the third conductive MOS transistor.

Further, a data input terminal, a negative output terminal, and a positive input terminal are provided.

Further, a data transmission switch circuit section is provided. This data transmission switch circuit section having a) an inverter circuit which inverts data input through the data input terminal, b) a sixth conductive MOS transistor whose gate is connected to an output terminal of the inverter circuit and drain is connected to a drain of the fourth conductive MOS transistor, c) a seventh conductive MOS transistor whose gate is connected to the data input terminal and drain is connected to a drain of the fifth conductive MOS transistor Further, gate of the fourth conductive MOS transistor being connected to the data input terminal, gate of the fifth conductive MOS transistor being connected to the output terminal of the inverter circuit, drain of the fourth conductive MOS transistor being connected to the negative output terminal, and drain of the fifth conductive MOS transistor being connected to the positive input terminal.

Further, an offset level adjusting circuit section is provided. This offset level adjusting circuit section having a second resistance whose one terminal is connected to GND and the other terminal is connected to sources of the sixth and seventh conductive MOS transistors.

Further, in the differential output circuit, the reference voltage circuit comprises a noise reduction circuit, a first current driving circuit section, a second current driving circuit section, and an amplification circuit.

The noise reduction circuit is having a) a third resistance, b) a first parasitic capacitance connected between the third resistance and GND, c) a fourth resistance, d) a second parasitic capacitance connected between the fourth resistance and GND.

The first current driving circuit section is having a) a fifth resistance and a sixth resistance connected in series, and b) a first bipolar transistor connected in series with the sixth resistance.

The second current driving circuit section is having a) a seventh resistance, and b) a second bipolar transistor connected in series with the seventh resistance.

In the amplification circuit, a) output terminal is connected to one terminals of the fifth and seventh resistances, b) negative input terminal is connected to a node between the third resistance and the first parasitic capacitor, and c) positive input terminal is connected to anode between the fourth resistance and the second parasitic capacitor.

The other terminal of the third resistance being connected to a node between the fifth and sixth resistances, and the other terminal of the fourth resistance being connected to a node between the seventh resistance and the second bipolar transistor.

Further, in the differential output circuit, the reference voltage circuit is provided with a reference voltage circuit section which is composed of an eight resistance whose one terminal is connected to GND and a ninth resistance whose one terminal is serially connected to the other terminal of the eighth, resistance and the other terminal is connected to a power-supply potential.

Further, in the differential output circuit, in the mirror circuit section, a ratio of transistor sizes of the fourth conductive MOS transistor and the fifth conductive MOS transistor is 1:1/n where n is a positive integer.

Further, the differential output circuit, which uses LVDS in order to obtain high-speed, low-voltage and low-noise transmission, is provided with the reference voltage circuit which outputs a constant voltage even if temperature, power-supply voltage and semiconductor manufacturing process vary.

Further, a constant-current circuit section is provided. This constant-current circuit section is having a) a reference voltage circuit which outputs a constant voltage even if any of the temperature, power-supply voltage and semiconductor manufacturing process varies, b) a first conductive MOS transistor whose source is connected to GND, c) a second conductive MOS transistor whose source is connected to a drain of the first conductive MOS transistor, d) a third conductive MOS transistor whose source is connected to a power-supply potential and a drain and a gate are connected to a drain of the second conductive MOS transistor, and e) an amplification circuit to a positive input terminal which the output terminal of the reference voltage circuit is connected, a negative input terminal is connected to a node between the source of the second conductive MOS transistor and the drain of the first conductive MOS transistor, and an output terminal is connected to a gate of the second conductive MOS transistor.

Further, a mirror circuit section is provided. This mirror circuit section is having a) a fourth conductive MOS transistor whose source is connected to the power-supply potential and gate is connected to a gate of the third conductive MOS transistor, and b) a fifth conductive MOS transistor and a sixth conductive MOS transistor whose sources are connected to a drain of the fourth conductive MOS transistor.

Further, data input terminal, a negative output terminal, and a positive input terminal are provided.

Further, a data transmission switch circuit section is provided. This data transmission switch circuit section is having a) an inverter circuit which inverts data input through the input terminal, b) a seventh conductive MOS transistor whose gate is connected to an output terminal of the inverter circuit and a drain is connected to a drain of the fifth conductive MOS transistor, c) an eighth conductive MOS transistor whose gate is connected to the data input terminal and a drain is connected to a drain of the fifth conductive MOS transistor.

Gate of the fifth conductive MOS transistor being connected to the data input terminal, gate of the sixth conductive MOS transistor being connected to the output terminal of the inverter circuit, drain of the seventh conductive MOS transistor being connected to the negative output terminal, and drain of the eighth conductive MOS transistor being connected to the positive output terminal.

Further, an offset level adjusting circuit section is provided. This offset level adjusting circuit section is having a ninth conductive MOS transistor whose source is connected to GND and drain is connected to sources of the seventh and eighth conductive MOS transistors.

Further, a resistance bias voltage generating circuit section is provided. This resistance bias voltage generating circuit section is having a) a resistance whose one terminal is connected to GND, and b) a tenth conductive MOS transistor whose source is connected to the power-supply potential and gate and drain being connected to the other terminal of the resistance.

Further, the differential output circuit, which uses LVDS in order to obtain high-speed, low-voltage and low-noise transmission, is provided with the reference voltage circuit, which outputs a constant voltage even if temperature, power-supply voltage and semiconductor manufacturing process varies.

Further, a constant-current circuit section is provided. This constant-current circuit section is having a) a reference voltage circuit which outputs a constant voltage even if any of the temperature, power-supply voltage and semiconductor manufacturing process varies, b) a first conductive MOS transistor whose source is connected to GND, b) a second conductive MOS transistor whose drain is connected to a drain and gate of the first conductive MOS transistor, c) a first resistance whose one terminal is connected to a power-supply potential and the other terminal is connected to a source of the second conductive MOS transistor, d) an amplification circuit to a negative input terminal which the output terminal of the reference voltage circuit is connected, a positive input terminal is connected to a node between the source of the second conductive MOS transistor and the first resistance, and an output terminal is connected to a gate of the second conductive MOS transistor.

Further, a mirror circuit section is provided. This mirror circuit section is having a) a third conductive MOS transistor whose source is connected to GND and gate is connected to the gate of the first conductive MOS transistor and drain of the second conductive MOS transistor, and b) a fifth conductive MOS transistor and a sixth conductive MOS transistor whose sources are connected to a drain of the third conductive MOS transistor.

Further, data input terminal, a negative output terminal, and a positive input terminal are provided.

Further, a data transmission switch circuit section is provided. This data transmission switch circuit section is having a) an inverter circuit which inverts data input through the input terminal, b) a sixth conductive MOS transistor whose gate is connected to an output terminal of the inverter circuit and drain is connected to a drain of the fifth conductive MOS transistor, c) a seventh conductive MOS transistor whose gate is connected to the data input terminal and drain is connected to a drain of the sixth conductive MOS transistor.

Gate of the fifth conductive MOS transistor being connected to the data input terminal, gate of the fourth conductive MOS transistor being connected to the output terminal of the inverter circuit, the drain of the fourth conductive MOS transistor being connected to the negative output terminal, and the drain of the fifth conductive MOS transistor being connected to the positive output terminal.

Further, an offset level adjusting circuit section is provided. This an offset level adjusting circuit section is having a second resistance whose one terminal is connected to the power-supply potential and the other terminal is connected to sources of the third and fourth conductive MOS transistors.

Further, in the differential output circuit, a resistance bias voltage generating circuit section is provided. This resistance bias voltage generating circuit section is constituted so that the first and second resistances are replaced by eight and ninth conductive MOS transistors biased to a linear area, and gate voltages of the eight and ninth conductive MOS transistors are supplied, and a third resistance whose one terminal is connected to GND is serially connected to a tenth conductive MOS transistor whose a source is connected to a power-supply potential and a gate and a drain are connected to the other terminal of the third resistance.

Other objects and features of this invention will become apparent from the following description with reference to the accompanying drawings.

DESCRIPTION OF THE PREFERRED EMBODIMENTS

Preferred embodiments of the present invention will be explained below.

Figure 1:
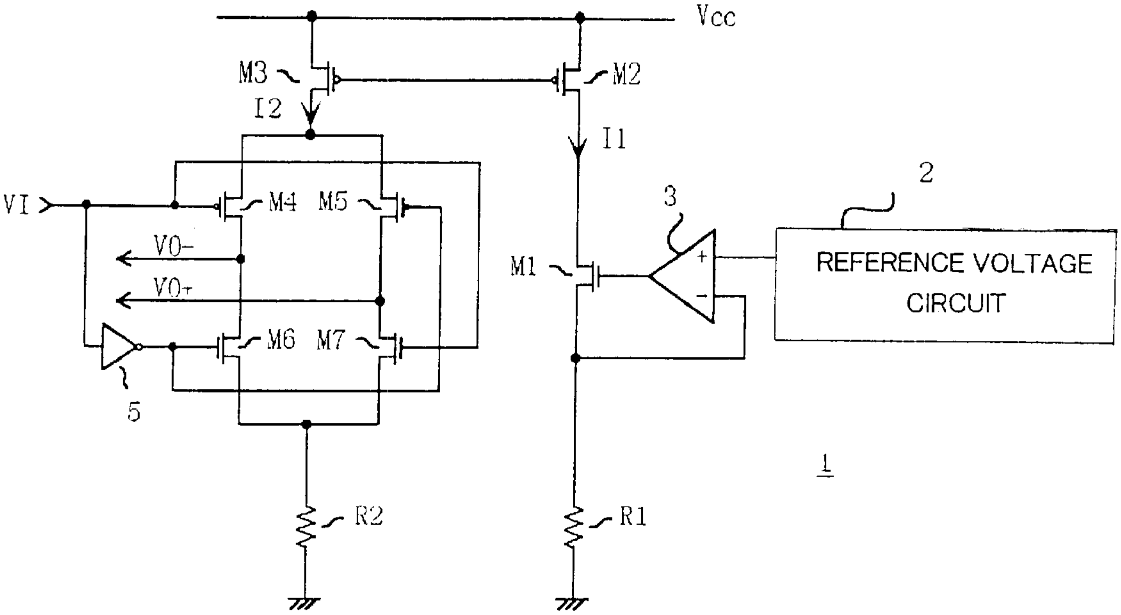
FIG. 1 is a circuit diagram of a differential output circuit according to a first embodiment of the present invention.

FIG. 1 is a circuit diagram of a differential output circuit according to a first embodiment of the present invention. This differential output circuit 1 is provided with a reference voltage circuit 2 which outputs a constant voltage if temperature, power-supply voltage and semiconductor manufacturing process vary.

A constant-current circuit section which is composed of a resistance R1, an N-channel MOS transistor M1, a P-channel MOS transistor M2 and an amplification circuit 3 is provided. One terminal of the resistance R1 is connected to GND. A source of the N-channel MOS transistor M1 is connected to the other terminal of the resistance R1. A source of the P-channel MOS transistor M2 is connected to a power-supply potential Vcc, and its drain is connected to a drain of the N-channel MOS transistor M1. An output terminal of the reference voltage circuit 2 is connected to a + input terminal of the amplification circuit 3, and its – input terminal is connected to the source of the N-channel MOS transistor M1, and its output terminal is connected to a gate of the N-channel MOS transistor M1.

A mirror circuit section which is composed of a P-channel MOS transistor M3, and P-channel MOS transistors M4 and M5 is provided. A source of the P-channel MOS transistor M3 is connected to the power-supply potential Vcc, and its gate is connected to a gate of the P-channel MOS transistor M2. Sources of the P-channel MOS transistors M4 and M5 are connected to a drain of the P-channel MOS transistor M3.

A data transmission switch circuit section which is composed of an inverter circuit 5, an N-channel MOS transistor M6 and an N-channel MOS transistor M7 is provided. The inverter circuit 5 inverts data VI input through a data input terminal. A gate of the N-channel MOS transistor M6 is connected to an output terminal of the inverter circuit 5, and its drain is connected to a drain of the P-channel MOS transistor M4. A gate of the N-channel MOS transistor M7 is connected to the data input terminal, and its drain is connected to a drain of the P-channel MOS transistor M5.

Gate of the P-channel MOS transistor M4 is also connected to the data input terminal, and gate of the P-channel MOS transistor M5 is also connected to the output terminal of the inverter circuit 5.

Drain of the P-channel MOS transistor M4 is connected to an output terminal VO–, and drain of the P-channel MOS transistor M5 is connected to an output terminal VO+.

An offset level adjusting circuit section or the like which is composed of a resistance R2 is provided. One terminal of the resistance R2 is connected to GND, and the other terminal is connected to sources of the N-channel MOS transistors M6 and M7.

Operation of the differential output circuit 1 will now be explained. At first, an output Vz of the reference voltage circuit 2 is used. A drain current I1 of the N-channel MOS transistor M1 is given according to a negative-feedback principle of the amplification circuit 3 as follows:

$$I1=Vz/R1.$$

Next, I1 is transferred to I2 by the mirror circuit section. Here, the P-channel MOS transistors M2 and M3 are designed to have the same size so that I1=I2.

Therefore, an offset level VOS of an output amplitude in the differential output circuit 1 is given as follows:

$$VOS=I1\times R2=I2\times R2=(Vz/R1)\times R2.$$

Namely, accuracy of VOS depends up on the variation in Vz, R1 and R2. The resistances are manufactured by a semiconductor, and have a certain degree of variation (ΔVz, ΔR1, ΔR2) in the three parameters of temperature, voltage and manufacturing process.

If the resistances R1 and R2 are made of the same material and their layouts are designed so as to match each other, it is easily possible to make ΔR1=ΔR2.

Namely, when the variation ΔVz, ΔR1 and ΔR2 of Vz, R1 and R2 occurs, ΔVOS is as follows:

$$\Delta VOS=(\Delta Vz/\Delta R1)\times\Delta R2=\Delta Vz.$$

Therefore, if the variation of Vz based on variation in the temperature, voltage and manufacturing process can be controlled accurately, ΔVOS can be approximately zero.

Figure 2:
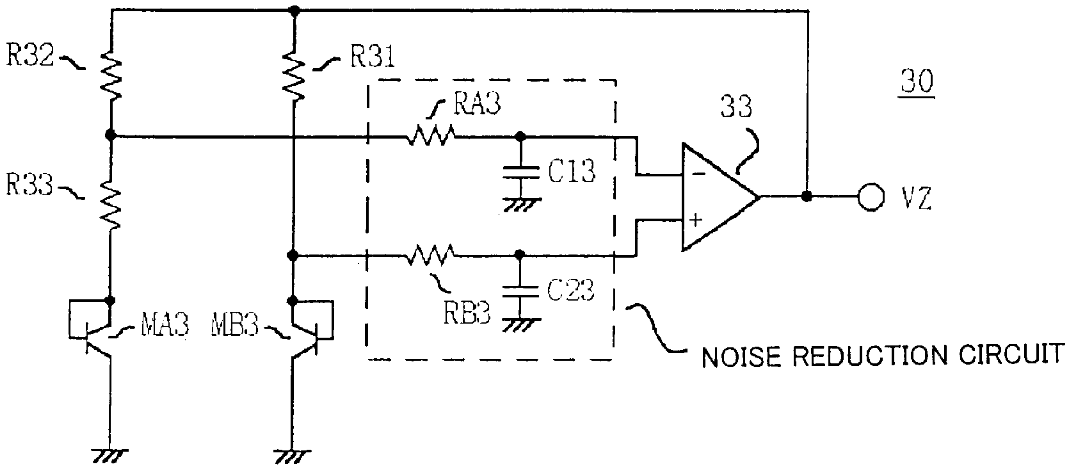
FIG. 2 is a circuit diagram of a reference voltage circuit of the differential output circuit according to a second embodiment of the present invention.

FIG. 2 is a circuit diagram of a reference voltage circuit of the differential output circuit according to a second embodiment. This reference voltage circuit 30 is provided with an amplification circuit 33. An output terminal of the amplification circuit 33 is connected to one terminals of resistances R31 and R32, a – input terminal is connected to the other terminal of the resistance R32, a resistance RA3 is connected to a parasitic capacitance C13, a + input terminal is connected to the other terminal of the resistance R31, and a resistance RB3 is connected to a parasitic capacitance C23.

The resistance RA3, the parasitic capacitance C13, the resistance RB3 and the parasitic capacitance C23 compose a noise reduction circuit.

Further, a first current driving circuit section is provided. This first current driving circuit section is composed of a resistance R33 whose one terminal is connected to the other terminal of the resistance R32, and a bipolar transistor MA3 which is serially connected to the other terminal of the resistance R33.

In addition, a second current driving circuit section or the like is provided. This second current driving circuit section is composed of a bipolar transistor MB3 which is serially connected to the other terminal of the resistance R31.

If a power-supply noise is generated in the differential output circuit, the noise is propagated because a closed loop circuit is constituted. However, the resistances RA3 and RB3 and the parasitic capacitors C13 and C23 compose a filter so that a change in the electric potential is suppressed and simultaneously the noise of Vz in the closed loop circuit can be reduced.

The reference voltage circuit of the differential output circuit according to the second embodiment is applied so that the change in Vz due to the power-supply noise is reduced and the accuracy of Vz is improved. As a result, a change in VOS can be controlled to be smaller.

Figure 3:
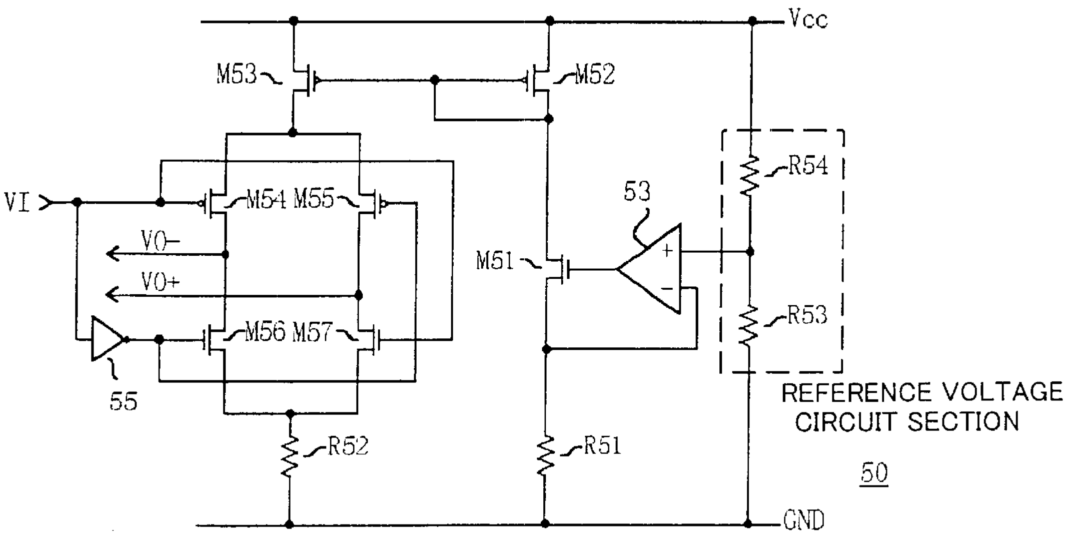
FIG. 3 is a circuit diagram of a differential output circuit according to a third embodiment of the present invention.

FIG. 3 is a circuit diagram of a differential output circuit according to a third embodiment. This differential output circuit 50 is provided with a reference voltage circuit section. The reference voltage circuit section is composed of a resistance R53 whose one terminal is connected to GND, and a resistance R54 whose one terminal is serially connected to the other terminal of the resistance R53 and the other terminal is connected to a power-supply potential Vcc.

Further, a constant-current circuit section is provided. This constant-current circuit section is composed of a resistance R51 whose one terminal is connected to GND, an N-channel MOS transistor M51 whose a source is connected to the other terminal of the resistance R51, a P-channel MOS transistor M52 whose a source is connected to the power-supply potential Vcc and drain and gate are connected to the drain of the N-channel MOS transistor M51, and an amplification circuit 53 whose a + input terminal is connected to a serial connection point between the resistance R53 and the resistance R54 and a – input terminal is connected to the source of the N-channel MOS transistor M51 and an output terminal is connected to a gate of the N-channel MOS transistor M51.

Further, a mirror circuit section is provided. This mirror circuit section is composed of a P-channel MOS transistor M53 whose a source is connected to the power-supply potential Vcc and gate is connected to the gate of the P-channel MOS transistor M52, and P-channel MOS transistors M54 and M55 whose sources are connected to a drain of the P-channel MOS transistor M53.

Further, a data transmission switch circuit section is provided. This data transmission switch circuit section is composed of an inverter circuit 55 which inverts data VI input through a data input terminal, an N-channel MOS transistor M56 whose gate is connected to the output terminal of the inverter circuit 55 and drain is connected to a drain of the P-channel MOS transistor M54, and an N-channel MOS transistor M57 whose gate is connected to the data input terminal and drain is connected to a drain of the P-channel MOS transistor M55.

Further, gate of the P-channel MOS transistor M54 is connected to the data input terminal, and gate of the P-channel MOS transistor M55 is connected to the output terminal of the inverter circuit 55.

Further, drain of the P-channel MOS transistor M54 is connected to an output terminal VO–, and the drain of the P-channel MOS transistor M55 is connected to an output terminal VO+.

Further, an offset level adjusting circuit section or the like is provided. This offset level adjusting circuit section is composed of a resistance R52 whose one terminal is connected to GND and the other terminal is connected to sources of the N-channel MOS transistors M56 and M57.

This differential output circuit 50 obtains a dividing voltage from a ratio of resistance to the power-supply potential Vcc. Therefore, even if the variation of temperature and manufacturing process occurs, since the resistances R53 and R54 are almost equal to each other, the dividing voltage Vz becomes constant.

Thus, Vz can be controlled accurately even if a variation in temperature and manufacturing process occurs.

Therefore, according to the third embodiment, the chip size can be smaller than that in the second embodiment.

Figure 4:
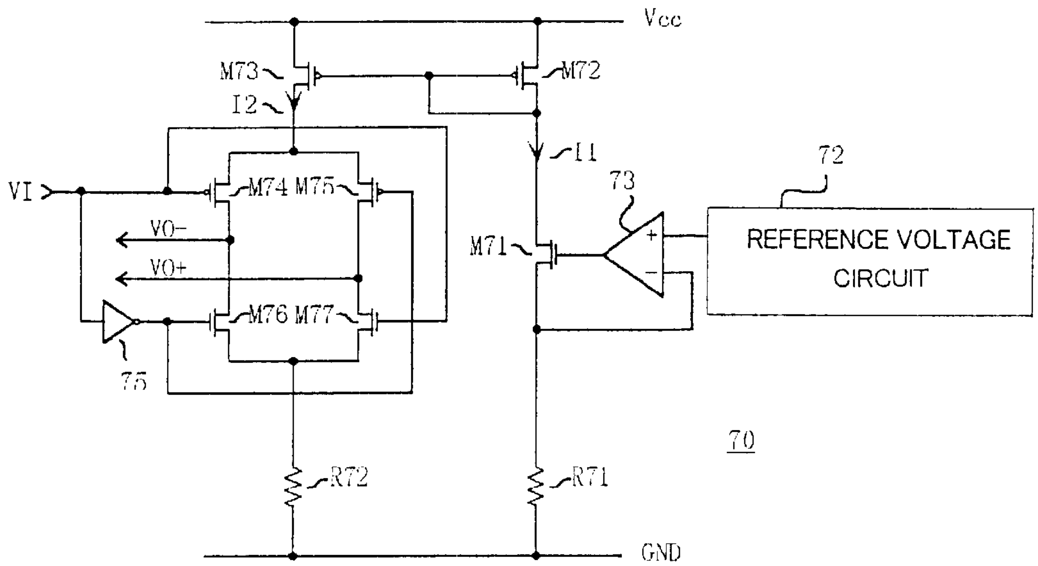
FIG. 4 is a circuit diagram of a differential output circuit according to a fourth embodiment of the present invention.

FIG. 4 is a circuit diagram of a differential output circuit according to a fourth embodiment. This differential output circuit 70 is provided with a reference voltage circuit 72 which outputs a constant voltage even if variation in temperature, power-supply voltage and a semiconductor manufacturing process occurs.

Further, a constant-current circuit section is provided. This constant-current circuit section is composed of a resistance R71, an N-channel MOS transistor M71, a P-channel MOS transistor M72 and an amplification circuit 73. One terminal of the resistance R71 is connected to GND. A source of the N-channel MOS transistor M71 is connected to the other terminal of the resistance R71. A source of the P-channel MOS transistor M72 is connected to a power-supply potential Vcc, and its drain and gate are connected to a drain of the N-channel MOS transistor M71. An output of the reference voltage circuit 72 is connected to a + input terminal of the amplification circuit 73, and its – input terminal of the amplification circuit 73 is connected to the source of the N-channel MOS transistor M71, and its output terminal is connected to a gate of the N-channel MOS transistor M71.

Further, a mirror circuit section is provided. This mirror circuit section is composed of a P-channel MOS transistor M73 whose source is connected to the power-supply potential Vcc and gate is connected to a gate of the P-channel MOS transistor M72, and P-channel MOS transistors M74 and M75 whose sources are connected to a drain of the P-channel MOS transistor M73.

Further, ratio of the transistor sizes of the P-channel MOS transistors M72 and M73 is set so that M73:M72=1:1/n.

Further, a data transmission switch circuit section is provided. This data transmission switch circuit section is composed of an inverter circuit 75, an N-channel MOS transistor M76 and an N-channel MOS transistor M77. The inverter circuit 75 inverts data VI input through a data input terminal. A gate of the N-channel MOS transistor M76 is connected to an output terminal of the inverter circuit 75, and its drain is connected to a drain of the P-channel MOS transistor M74. A gate of the N-channel MOS transistor M77 is connected to the data input terminal, and its drain is connected to a drain of the P-channel MOS transistor M75.

Further, gate of the P-channel MOS transistor M74 is also connected to the data input terminal, and gate of the P-channel MOS transistor M75 is connected to the output terminal of the inverter circuit 75.

Further, drain of the p-channel MOS transistor M74 is connected to an output terminal VO–, and the drain of the P-channel MOS transistor M75 is connected to an output terminal VO+.

Further, an offset level adjusting circuit section or the like is provided. This offset level adjusting circuit section is composed of a resistance R72 whose one terminal is connected to GND and the other terminal is connected to sources of the N-channel MOS transistors M76 and M77.

That is, drain currents I1 and I2 are proportional to the sizes of the P-channel MOS transistors M72 and M73. That is, I2=I1×M73/M72.

For example, when the size of the P-channel MOS transistor M73 is W3 when a driving current of αmA is required for I2, the size of the p-channel MOS transistor M72 is set to 1/n of W3. As a result, since I1 becomes 1/n, the chip size of the constant-current circuit section can be reduced by 1/n even if the value of the driving current I2 is same.

According to the fourth embodiment, the drain current ratio in the constant-current circuit section varies so that the chip size of the constant-current circuit section can be small.

Figure 5:
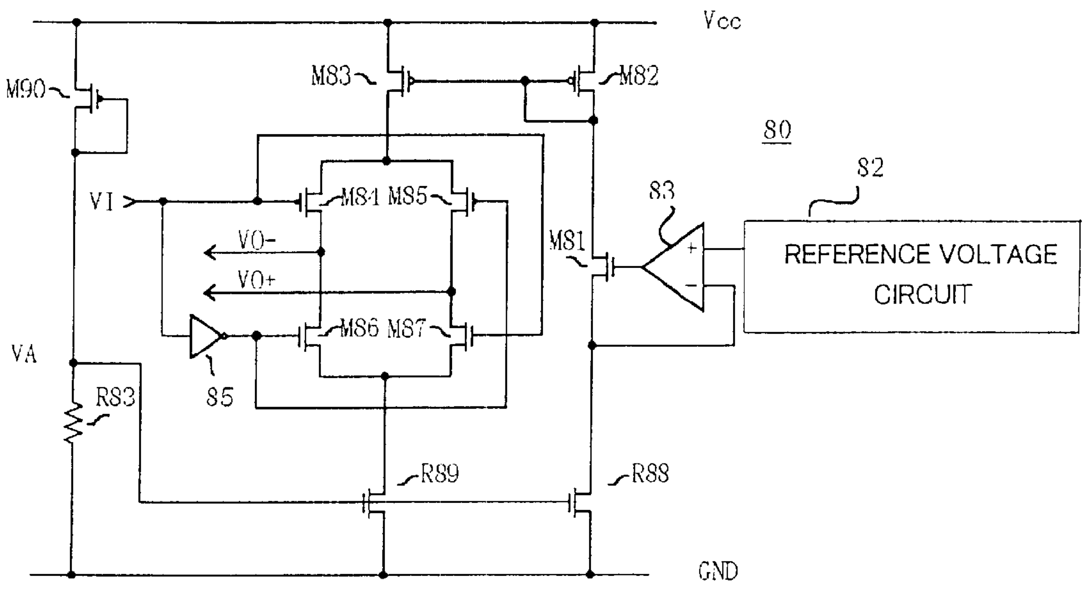
FIG. 5 is a circuit diagram of a differential output circuit according to a fifth embodiment of the present invention.

FIG. 5 is a circuit diagram of a differential output circuit according to a fifth embodiment. This differential output circuit 80 is provided with a reference voltage circuit 82 which outputs a constant voltage even if a variation in the temperature, power-supply voltage and semiconductor manufacturing process occurs.

Further, a constant-current circuit section is provided. This constant-current circuit section is composed of an N-channel MOS transistor M88, an N-channel MOS transistor M81, a P-channel MOS transistor M82 and an amplification circuit 83. A source of the N-channel MOS transistor M88 is connected to GND. A source of the N-channel MOS transistor M81 is connected to a drain of the N-channel MOS transistor M88. A source of the P-channel MOS transistor M82 is connected to a power-supply potential Vcc, and its drain and gate are connected to a drain of the N-channel MOS transistor M81. An output of the reference voltage circuit 82 is connected to a + input terminal of the amplification circuit 83, and a − input terminal is connected to the source of the N-channel MOS transistor M81, and an output terminal is connected to a gate of the N-channel MOS transistor M81.

Further, a mirror circuit section is provided. This mirror circuit section is composed of a P-channel MOS transistor M83 whose a source is connected to the power-supply potential Vcc and a gate is connected to the gate of the P-channel MOS transistor M82, and P-channel MOS transistors M84 and M85 whose sources are connected to a drain of the P-channel MOS transistor M83.

Further, a data transmission switch circuit section is provided. This data transmission switch circuit section is composed of an inverter circuit 85, an N-channel MOS transistor M86 and an N-channel MOS transistor M87. The inverter circuit 85 inverts data VI input through a data input terminal. A gate of the N-channel MOS transistor M86 is connected to an output terminal of the inverter circuit 85 and its drain is connected to a drain of the P-channel MOS transistor M84. A gate of the N-channel MOS transistor M87 is connected to the data input terminal, and its drain is connected to a drain of the P-channel MOS transistor M85.

Further, gate of the P-channel MOS transistor M84 is also connected to the data input terminal, and gate of the P-channel MOS transistor M85 is connected to the output terminal of the inverter circuit 85.

Further, drain of the P-channel MOS transistor M84 is connected to an output terminal VO−, and the drain of the P-channel MOS transistor M85 is connected to an output terminal VO+.

Further, an offset level adjusting circuit section is provided. This offset level adjusting circuit section is composed of an N-channel MOS transistor M89 whose a source is connected to GND and a drain is connected to sources of the N-channel MOS transistors M86 and M87.

Further, a resistance bias voltage generating circuit section is provided. This resistance bias voltage generating circuit section is composed of a resistance R83 and a P-channel MOS transistor M90 connected serially. One terminal of the resistance R83 is connected to GND. A source of the P-channel MOS transistor M90 is connected to the power-supply potential Vcc, and its gate and drain are connected to the other terminal of the resistance R83.

Further, gate voltages VA of the N-channel MOS transistors M88 and M89 biased to a linear area are applied from the resistance bias voltage generating circuit section.

Since an on-resistance of the MOS transistor can be utilized for composing the resistance with a semiconductor, on-resistances of the N-channel MOS transistors M88 and M89 are used.

On-resistance rds of the MOS transistor is represented by the,following equation:

$$\begin{aligned} 1/rds &= dIds/dVds \\ &= \beta(Vgs - Vth - Vds) \end{aligned} \tag{1}$$

According to the equation (1), $$rds=1/\beta(Vgs-Vth-Vds).$$

Therefore, since the on-resistance rds of the MOS transistor does not influence the variation of VOS, even if there occurs a variation in the manufacturing occurs, the accuracy of VOS is not influenced.

According to the fifth embodiment, the structure of the bias resistance is devised so that the chip size can be smaller.

Figure 6:
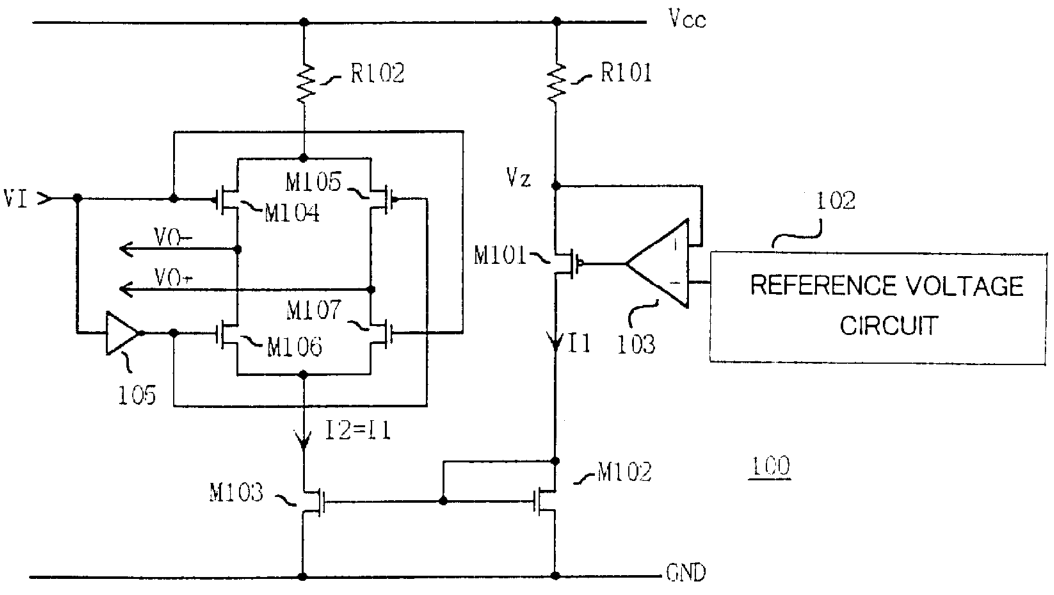
FIG. 6 is a circuit diagram of a differential output circuit according to a sixth embodiment of the present invention.
Figure 7:
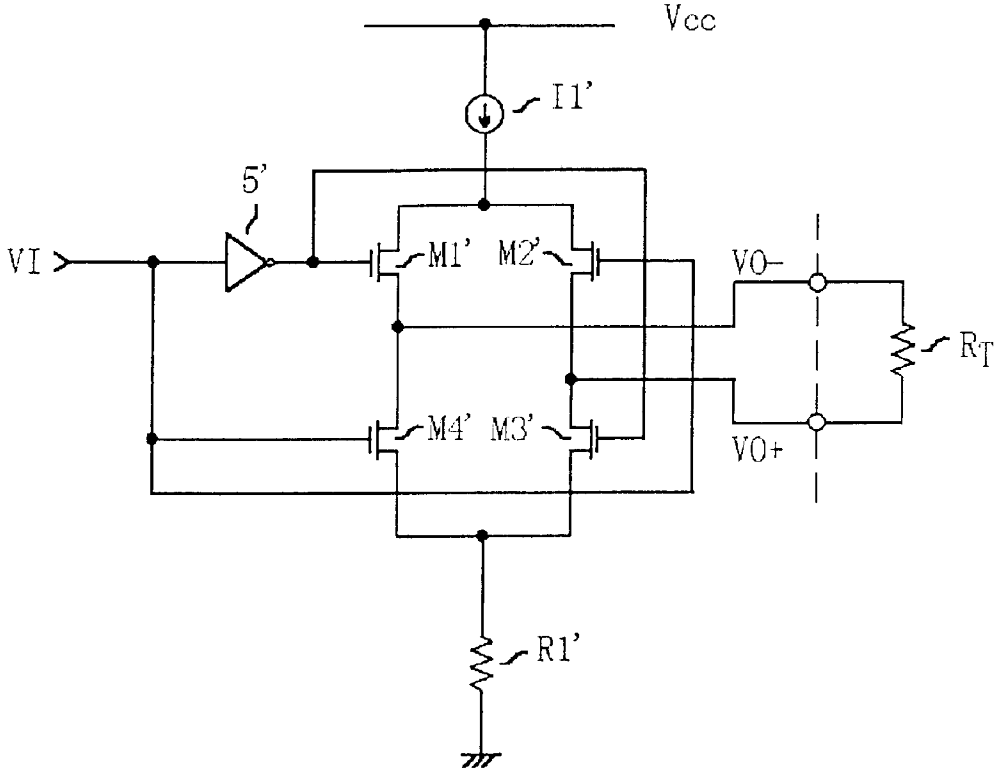
FIG. 7 is a circuit diagram of a conventional differential output circuit.
Figure 8:
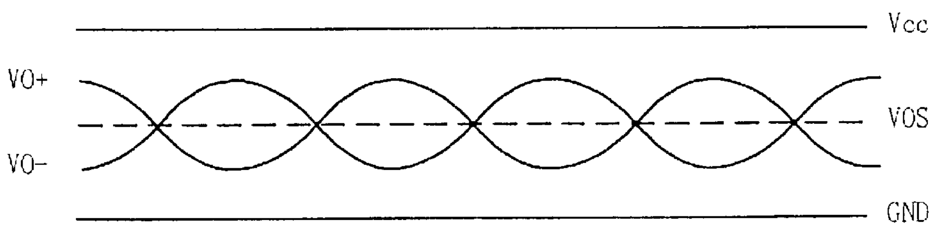
FIG. 8 is an output waveform chart of a conventional LVDS.

FIG. 6 is a circuit diagram of a differential output circuit according to a sixth embodiment. This differential output circuit 100 is provided with a reference voltage circuit 102 which outputs a constant voltage even if temperature, power-supply voltage and semiconductor manufacturing process disperse.

Further, a constant-current circuit section is provided. This constant-current circuit section is composed of an N-channel MOS transistor M102, a P-channel MOS transistor M101, a resistance 101 and an amplification circuit 103. A source of the N-channel MOS transistor M102 is connected to GND. A drain of the P-channel MOS transistor M101 is connected to a drain of the N-channel MOS transistor M102. One terminal of the resistance 101 is connected to a power-supply potential Vcc, and the other terminal is connected to a source of the P-channel MOS transistor M101. An output of the reference voltage circuit 102 is connected to a − input terminal of the amplification circuit 103 and its + input terminal is connected to a source of the P-channel MOS transistor M101, and its output terminal is connected to a gate of the P-channel MOS transistor M101.

Further, gate of the N-channel MOS transistor M102 is also connected to the drain of the P-channel MOS transistor Further, a mirror circuit section is provided. This mirror circuit section is composed of an N-channel MOS transistor M103 whose source is connected to GND and gate is connected to the gate of the N-channel MOS transistor M102, and N-channel MOS transistors M106 and M107 whose sources are connected to a drain of the N-channel MOS transistor M103.

Moreover, a data transmission switch circuit section is provided. This data transmission switch circuit section is composed of an inverter circuit 105, a P-channel MOS transistor M105, and a P-channel MOS transistor M104. The inverter circuit 105 inverts data VI input through a data input terminal. A gate of the P-channel MOS transistor M105 is connected to an output terminal of the inverter circuit 105, and its drain is connected to a drain of the N-channel MOS transistor M107. A gate of the P-channel MOS transistor M104 is connected to the data input terminal, and its drain is connected to a drain of the N-channel MOS transistor M106.

Further, gate of the N-channel MOS transistor M107 is connected to the data input terminal, and gate of the N-channel MOS transistor M106 is connected to the output terminal of the inverter circuit 105.

Further, drain of the N-channel MOS transistor M106 is connected to an output terminal VO−, and drain of the N-channel MOS transistor M107 is connected to an output terminal VO+.

Further, an offset level adjusting circuit section or the like is provided. This offset level adjusting circuit section is composed of a resistance R102 whose one terminal is connected to the power-supply potential Vcc and the other terminal is connected to sources of the P-channel MOS transistors M104 and M105.

Operation of the differential output circuit 100 will now be explained. At first, an output Vz of the reference voltage circuit 102 is used. A drain current I101 of the P-channel MOS transistor M101 is represented as follows according to a negative-feedback principle of the amplification circuit 103:

$$I101=Vz/R101.$$

Next, I101 is transferred to I102 by the mirror circuit section. Here, the N-channel MOS transistors M102 and M103 are designed to have equal sizes so that I101=I102.

Therefore, an offset level VOS of the output amplitude in the differential output circuit 100 is represented by $$VOS=I101\times R102=I102\times R102=(Vz/R101)\times R102.$$

That is, the accuracy of VOS is determined by the variation of Vz, R101 and R102. Resistances are manufactured by a semiconductor process, therefore, there is a variation to some degree (ΔVz, ΔR101, ΔR102) depending upon the temperature, voltage and manufacturing process.

Further, R101 and R102 are formed by the same material and their layouts are designed so as to match each other. As a result, they can easily establish a relationship ΔR101=ΔR102.

Namely, when the variation ΔVz, ΔR101 and ΔR102 of Vz, R101 and R102 occur, ΔVOS becomes as follows:

$$\Delta VOS=(\Delta Vz/\Delta R101)\times\Delta R102=\Delta Vz.$$

Therefore, when the dispersion of Vz can be controlled accurately with respect to the three kinds of dispersion of temperature, voltage and manufacturing process, VOS can be approximately zero.

Therefore, according to the sixth embodiment, VOS can be controlled more accurately than the first embodiment.

As a seventh embodiment, the reference voltage circuit 30 in the second embodiment (see FIG. 2) may be applied to the differential output circuit 100 of the sixth embodiment (see FIG. 6). In this case, the effect which is the same as that in the sixth embodiment can be obtained.

As an eight embodiment the reference voltage circuit in the third embodiment (see FIG. 3) may be applied to the differential output circuit 100 of the sixth embodiment (see FIG. 6). In this case, the effect which is the same as that in the third embodiment can be obtained.

As a ninth embodiment the reference voltage circuit 72 in the fourth embodiment (see FIG. 4) may be applied to the differential output circuit 100 of the sixth embodiment (see FIG. 6). In this case, the effect which is the same as that in the fourth embodiment can be obtained.

As a tenth embodiment the on-resistance of the MOS transistor in the fifth embodiment (see FIG. 5) may be applied to the differential output circuit 100 of the sixth embodiment (see FIG. 6). In this case, the effect which is the same as that in the fifth embodiment can be obtained.

That is, a resistance bias voltage generating circuit section is provided. This resistance bias voltage generating circuit section is composed so that a resistance and a P-channel MOS transistor are connected serially. One terminal of the resistance is connected to GND. A source of the P-channel MOS transistor is connected to a power-supply voltage Vcc, and its gate and drain are connected to the other terminal of the resistance.

Further, resistances R101 and R102 are replaced by N-channel MOS transistors M108 and M109 which are biased to the linear area, and their gate voltages VA are given from the resistance bias voltage generating circuit section (not shown).

As explained above, the differential output circuit of the present invention is provided with the reference voltage circuit which outputs a constant voltage even if there occurs variation in temperature, power-supply voltage or manufacturing process. Accordingly, variation in the dividing voltage Vz due to variation in temperature, power-supply voltage or manufacturing process can be controlled accurately, as a result variation in VOS can be made substantially zero. Further, in the differential output circuit of the present invention, chip size can be made smaller.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A differential output circuit which uses LVDS in order to obtain high-speed, low-voltage and low-noise transmission, said differential output circuit comprising:

a constant-current circuit section having a) a reference voltage circuit which outputs a constant voltage even if any of the temperature, power-supply voltage and semiconductor manufacturing process varies, b) a first resistance whose one terminal is connected to GND, c) a first conductive MOS transistor whose source is connected to the other terminal of said first resistance, d) a second conductive MOS transistor whose a source is connected to a power-supply potential and a drain is connected to a drain of said first conductive MOS transistor, and e) an amplification circuit whose an output terminal of said reference voltage circuit is connected to a positive input terminal, a negative input terminal is connected to the source of said first conductive MOS transistor, and an output terminal is connected to a gate of said first conductive MOS transistor;

a mirror circuit section having a) a third conductive MOS transistor whose source is connected to said power-supply potential and gate is connected to a gate of said second conductive MOS transistor, and b) a fourth conductive MOS transistor and a fifth conductive MOS transistor whose sources are connected to a drain of said third conductive MOS transistor;

a data input terminal;

a negative output terminal;

a positive input terminal;

a data transmission switch circuit section having a) an inverter circuit which inverts data input through said data input terminal, b) a sixth conductive MOS transistor whose gate is connected to an output terminal of said inverter circuit and drain is connected to a drain of said fourth conductive MOS transistor, c) a seventh conductive MOS transistor whose gate is connected to said data input terminal and drain is connected to a drain of said fifth conductive MOS transistor, wherein gate of said fourth conductive MOS transistor being connected to said data input terminal, gate of said fifth conductive MOS transistor being connected to the output terminal of said inverter circuit, drain of said fourth conductive MOS transistor being connected to said negative output terminal, and drain of said fifth conductive MOS transistor being connected to said positive input terminal; and an offset level adjusting circuit section having a second resistance whose one terminal is connected to GND and the other terminal is connected to sources of said sixth and seventh conductive MOS transistors.

2. The differential output circuit according to claim 1 wherein said reference voltage circuit having a noise reduction circuit having a) a third resistance, b) a first parasitic capacitor connected between said third resistance and GND, c) a fourth resistance, d) a second parasitic capacitor connected between said fourth resistance and GND, a first current driving circuit section having a) a fifth resistance and a sixth resistance connected in series, and b) a first bipolar transistor connected in series with said sixth resistance;

a second current driving circuit section having a) a seventh resistance, and b) a second bipolar transistor connected in series with said seventh resistance; and an amplification circuit whose a) output terminal is connected to one terminals of said fifth and seventh resistances, b) negative input terminal is connected to a node between said third resistance and said first parasitic capacitor, and c) positive input terminal is connected to a node between said fourth resistance and said second parasitic capacitor, wherein the other terminal of said third resistance being connected to a node between said fifth and sixth resistances, and the other terminal of said fourth resistance being connected to a node between said seventh resistance and said second bipolar transistor.

3. The differential output circuit according to claim 1 wherein said reference voltage circuit is provided with a reference voltage circuit section composed of an eight resistance whose one terminal is connected to GND and a ninth resistance whose one terminal is serially connected to the other terminal of said eighth resistance and the other terminal is connected to a power-supply potential.

4. The differential output circuit according to claim 1, wherein in said mirror circuit section, a ratio of transistor sizes of said fourth conductive MOS transistor and said fifth conductive MOS transistor is 1:1/n where n is a positive integer.

5. A differential output circuit which uses LVDS in order to obtain high-speed, low-voltage and low-noise transmission, said differential output circuit comprising:

a constant-current circuit section having a) a reference voltage circuit which outputs a constant voltage even if any of the temperature, power-supply voltage and semiconductor manufacturing process varies, b) a first conductive MOS transistor whose source is connected to GND, c) a second conductive MOS transistor whose source is connected to a drain of said first conductive MOS transistor, d) a third conductive MOS transistor whose source is connected to a power-supply potential and a drain and a gate are connected to a drain of said second conductive MOS transistor, and e) an amplification circuit to a positive input terminal which the output terminal of said reference voltage circuit is connected, a negative input terminal is connected to a node between the source of said second conductive MOS transistor and the drain of said first conductive MOS transistor, and an output terminal is connected to a gate of said second conductive MOS transistor;

a mirror circuit section having a) a fourth conductive MOS transistor whose source is connected to said power-supply potential and gate is connected to a gate of said third conductive MOS transistor, and b) a fifth conductive MOS transistor and a sixth conductive MOS transistor whose sources are connected to a drain of said fourth conductive MOS transistor;

a data input terminal;

a negative output terminal;

a positive input terminal;

a data transmission switch circuit section having a) an inverter circuit which inverts data input through said input terminal, b) a seventh conductive MOS transistor whose gate is connected to an output terminal of said inverter circuit and a drain is connected to a drain of said fifth conductive MOS transistor, c) an eighth conductive MOS transistor whose gate is connected to said data input terminal and a drain is connected to a drain of said fifth conductive MOS transistor, wherein gate of said fifth conductive MOS transistor being connected to said data input terminal, gate of said sixth conductive MOS transistor being connected to the output terminal of said inverter circuit, drain of said seventh conductive MOS transistor being connected to said negative output terminal, and drain of said eighth conductive MOS transistor being connected to said positive output terminal;

an offset level adjusting circuit section having a ninth conductive MOS transistor whose source is connected to GND and drain is connected to sources of said seventh and eighth conductive MOS transistors; and a resistance bias voltage generating circuit section having a) a resistance whose one terminal is connected to GND, and b) a tenth conductive MOS transistor whose source is connected to said power-supply potential and gate and drain being connected to the other terminal of said resistance.

6. A differential output circuit which uses LVDS in order to obtain high-speed, low-voltage and low-noise transmission, said differential output circuit comprising:

a constant-current circuit section having a) a reference voltage circuit which outputs a constant voltage even if any of the temperature, power-supply voltage and semiconductor manufacturing process varies, b) a first conductive MOS transistor whose source is connected to GND, b) a second conductive MOS transistor whose drain is connected to a drain and gate of said first conductive MOS transistor, c) a first resistance whose one terminal is connected to a power-supply potential and the other terminal is connected to a source of said second conductive MOS transistor, d) an amplification circuit to a negative input terminal which the output terminal of said reference voltage circuit is connected, a positive input terminal is connected to a node between the source of said second conductive MOS transistor and said first resistance, and an output terminal is connected to a gate of said second conductive MOS transistor; and a mirror circuit section having a) a third conductive MOS transistor whose source is connected to GND and gate is connected to the gate of said first conductive MOS transistor and drain of said second conductive MOS transistor, and b) a fifth conductive MOS transistor and a sixth conductive MOS transistor whose sources are connected to a drain of said third conductive MOS transistor;

a data input terminal;

a negative output terminal;

a positive input terminal;

a data transmission switch circuit section having a) an inverter circuit which inverts data input through said input terminal, b) a sixth conductive MOS transistor whose gate is connected to an output terminal of said inverter circuit and drain is connected to a drain of said fifth conductive MOS transistor, c) a seventh conductive MOS transistor whose gate is connected to said data input terminal and drain is connected to a drain of said sixth conductive MOS transistor, wherein gate of said fifth conductive MOS transistor being connected to said data input terminal, gate of said fourth conductive MOS transistor being connected to the output terminal of said inverter circuit, the drain of said fourth conductive MOS transistor being connected to said negative output terminal, and the drain of said fifth conductive MOS transistor being connected to said positive output terminal; and an offset level adjusting circuit section having a second resistance whose one terminal is connected to said power-supply potential and the other terminal is connected to sources of said sixth and seventh conductive MOS transistors.

7. The differential output circuit according to claim 6 wherein said reference voltage circuit having a noise reduction circuit having a) a third resistance, b) a first parasitic capacitance connected between said third resistance and GND, c) a fourth resistance, d) a second parasitic capacitance connected between said fourth resistance and GND, a first current driving circuit section having a) a fifth resistance and a sixth resistance connected in series, and b) a first bipolar transistor connected in series with said sixth resistance;

a second current driving circuit section having a) a seventh resistance, and b) a second bipolar transistor connected in series with said seventh resistance; and an amplification circuit whose a) output terminal is connected to one terminals of said fifth and seventh resistances, b) negative input terminal is connected to a node between said third resistance and said first parasitic capacitor, and c) positive input terminal is connected to a node between said fourth resistance and said second parasitic capacitor, wherein the other terminal of said third resistance being connected to a node between said fifth and sixth resistances, and the other terminal of said fourth resistance being connected to a node between said seventh resistance and said second bipolar transistor.

8. The differential output circuit according to claim 6, wherein said reference voltage circuit is provided with a reference voltage circuit section composed of an eight resistance whose one terminal is connected to GND and a ninth resistance whose one terminal is serially connected to the other terminal of said eighth resistance and the other terminal is connected to a power-supply potential.

9. The differential output circuit according to claim 6, wherein in said mirror circuit section, a ratio of transistor sizes of said fourth conductive MOS transistor and said fifth conductive MOS transistor is 1:1/n where n is a positive integer.

10. The differential output circuit according to claim 6, comprising a resistance bias voltage generating circuit section which is constituted so that said first and second resistances are replaced by eight and ninth conductive MOS transistors biased to a linear area, and gate voltages of said eight and ninth conductive MOS transistors are supplied, and a third resistance whose one terminal is connected to GND is serially connected to a tenth conductive MOS transistor whose a source is connected to a power-supply potential and a gate and a drain are connected to the other terminal of said third resistance.

11. The differential output circuit according to claim 1, wherein said first conductive MOS transistor, sixth conductive MOS transistor and seventh conductive MOS transistor are NMOS transistors, and said second conductive MOS transistor, third conductive MOS transistor, fourth conductive MOS transistor and fifth conductive MOS transistors are PMOS transistors.

12. The differential output circuit according to claim 5, wherein said first conductive MOS transistor, sixth conductive MOS transistor and seventh conductive MOS transistor are NMOS transistors, and said second conductive MOS transistor, third conductive MOS transistor, fourth conductive MOS transistor and fifth conductive MOS transistors are PMOS transistors.

13. The differential output circuit according to claim 6, wherein said first conductive MOS transistor, sixth conductive MOS transistor and seventh conductive MOS transistor are NMOS transistors, and said second conductive MOS transistor, third conductive MOS transistor, fourth conductive MOS transistor and fifth conductive MOS transistors are PMOS transistors.

* * * * *